US010725952B2

(12) United States Patent
Bell

(10) Patent No.: US 10,725,952 B2
(45) Date of Patent: *Jul. 28, 2020

(54) ACCESSING STATUS INFORMATION

(71) Applicant: Micron Technology, Inc., Boise, ID (US)

(72) Inventor: Debra M. Bell, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/415,841

(22) Filed: May 17, 2019

(65) Prior Publication Data

US 2019/0272243 A1 Sep. 5, 2019

Related U.S. Application Data

(63) Continuation of application No. 15/220,177, filed on Jul. 26, 2016, now Pat. No. 10,303,632.

(51) Int. Cl.
*G06F 13/16* (2006.01)
*G06F 13/366* (2006.01)
(Continued)

(52) U.S. Cl.
CPC .......... *G06F 13/366* (2013.01); *G06F 11/00* (2013.01); *G06F 13/1668* (2013.01);
(Continued)

(58) Field of Classification Search
CPC ... G06F 13/1668; G06F 13/366; G06F 13/287
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
(Continued)

*Primary Examiner* — Ernest Unelus
(74) *Attorney, Agent, or Firm* — Brooks, Cameron & Huebsch, PLLC

(57) ABSTRACT

The present disclosure includes apparatuses and methods related to accessing status information. One example apparatus comprises a host and a memory device coupled to the host. The memory device includes a controller configured to provide, to a status arbiter, a status signal indicating whether a status register of the controller contains generated status information. Responsive to the status signal indicating that the status register contains the generated status information, the controller can also provide the status information from the controller to the status arbiter via a status intermediary.

20 Claims, 7 Drawing Sheets

(51) Int. Cl.
*G11C 7/00* (2006.01)
*G06F 11/00* (2006.01)
*G11C 7/24* (2006.01)
*G06F 13/24* (2006.01)
*G06F 13/28* (2006.01)

(52) U.S. Cl.
CPC ............ *G06F 13/24* (2013.01); *G06F 13/287* (2013.01); *G11C 7/00* (2013.01); *G11C 7/24* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,469,545 A * | 11/1995 | Vanbuskirk ......... G06F 13/4022 370/235 |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |

(56) References Cited

U.S. PATENT DOCUMENTS

| | | |
|---|---|---|
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008003 A1 | 7/2001 | Klein |
| 2001/0008492 A1 | 7/2001 | Higashiho |
| 2001/0010057 A1 | 7/2001 | Yamada |
| 2001/0011318 A1 | 8/2001 | Dalvi et al. |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0164683 A1 | 6/2009 | Hobler |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0217917 A1* | 8/2010 | Bryant-Rich ............ G11C 7/24 711/103 |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0264846 A1 | 10/2011 | Oh |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0047318 A1 | 2/2012 | Yoon et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0100744 A1 | 4/2015 | Mirichigani et al. |
| 2015/0120987 A1 | 4/2015 | Wheeler |
| 2015/0134713 A1 | 5/2015 | Wheeler |
| 2015/0169245 A1 | 6/2015 | Lassa |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |

(56) References Cited

U.S. PATENT DOCUMENTS

| | | |
|---|---|---|
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2017/043592, dated Oct. 17, 2017, 10 pages.

Extended European Search Report and Written Opinion for related EP Application No. 17835082.3, dated Dec. 16, 2019, 7 pages.

\* cited by examiner

ACCESSING STATUS INFORMATION

PRIORITY INFORMATION

This application is a Continuation of U.S. application Ser. No. 15/220,177, filed Jul. 26, 2016, the contents of which are included herein by reference.

TECHNICAL FIELD

The present disclosure relates generally to semiconductor memory and methods, and more particularly, to apparatuses and methods related to accessing status information.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation (e.g., a compute operation) on data (e.g., one or more operands). As used herein, a compute operation can be, for example, a Boolean operation, such as AND, OR, NOT, NOT, NAND, NOR, and XOR, and/or other operations (e.g., invert, shift, arithmetic, statistics, among many other possible operations) that may involve manipulating data. For example, functional unit circuitry may be used to perform the arithmetic operations, such as addition, subtraction, multiplication, and division on operands, via a number of logical operations. A compute operation such as described above can be distinguished from a "memory operation," which, as used herein, can refer to an operation that does not involve data manipulation (e.g., via a functional unit often associated with a processing resource). Examples of memory operations include data read, data write, and data refresh operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processing in memory device, in which a processor may be implemented internally and/or near to a memory (e.g., directly on a same chip as the memory array). A processing in memory device may save time and/or may reduce power consumption by reducing or eliminating the amount of data transfer over a bus in association with performing compute operations, for example.

In various instances, it can be useful for a host, such as a host processor, to access status information from a memory device. For example, such status information may relate to flow control, debugging, exceptions, and/or errors, among various other status information associated with operations performed by the memory device.

DETAILED DESCRIPTION

Figure 1A:
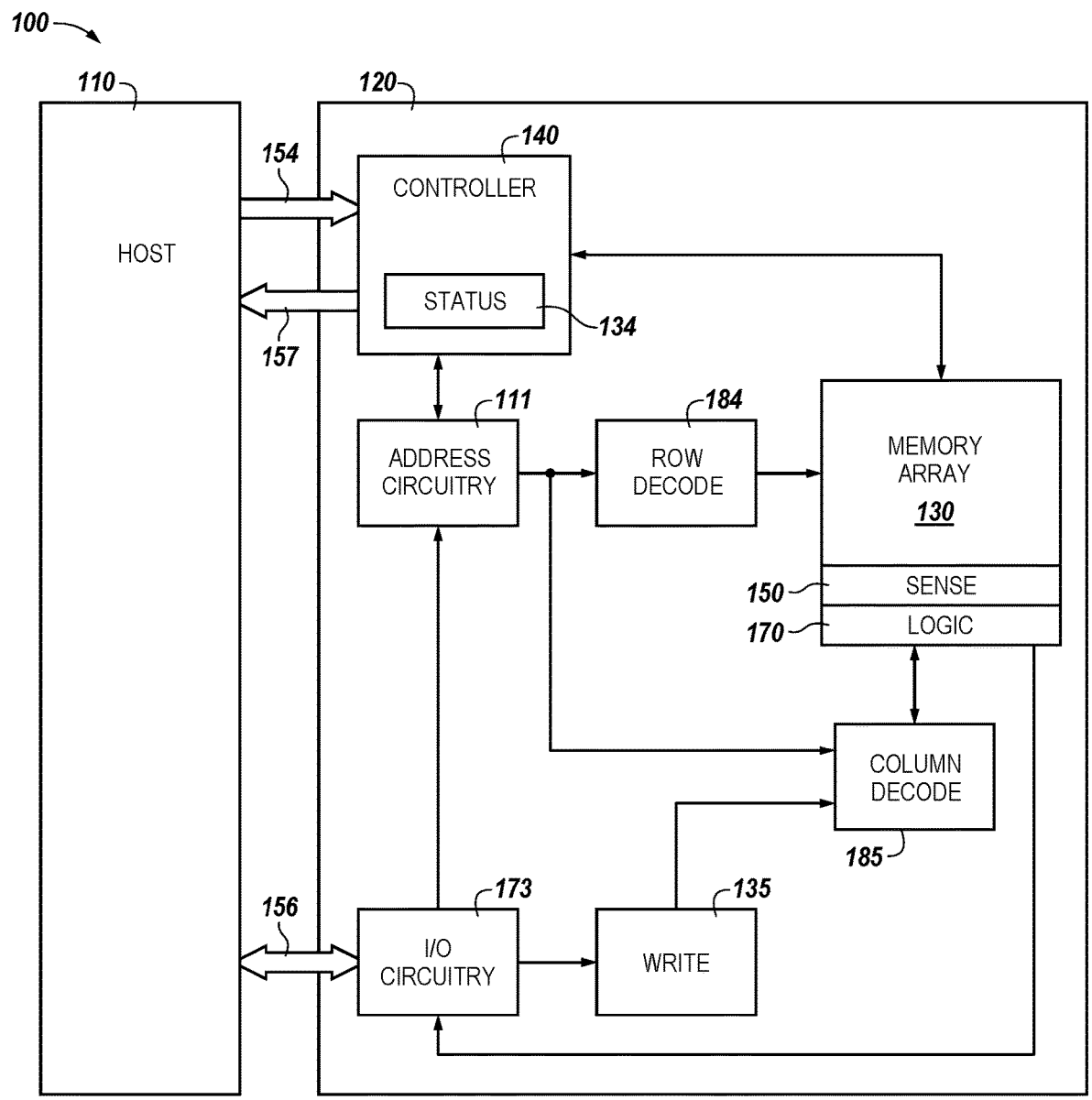
FIG. 1A is a block diagram of an apparatus in the form of a computing system including a memory device in accordance with a number of embodiments of the present disclosure.

The present disclosure includes apparatuses and methods related to accessing status information. The present disclosure includes apparatuses and methods related to accessing status information. One example apparatus comprises a host and a memory device coupled to the host. The memory device includes a controller configured to provide, to a status arbiter, a status signal indicating whether a status register of the controller contains generated status information. Responsive to the status signal indicating that the status register contains the generated status information, the controller can also provide the status information from the controller to the status arbiter via a status intermediary.

Embodiments of the present disclosure can include status channels having various benefits as compared to previous approaches. For example, as compared to previous approaches, a number of embodiments can include reduced logic (e.g., fewer logic components and/or simplified logic), more efficient routing (e.g., routing via fewer data paths), and/or latency reduction associated with providing status information from a controller of a memory device to a host. For instance, with respect to reduced logic, embodiments of the present disclosure may transfer status information generated by a controller from a status register local to the controller to the host without re-storing the status information in a separate set of status registers (e.g., a status FIFO (first in, first out)) of a status aggregator, for example.

Also, with respect to more efficient routing, in various instances, a memory device may include multiple memory arrays each having corresponding controllers for performing operations (e.g., memory operations and/or compute operations, etc.) on the arrays. The controllers may each have a number of status registers configured to store status information (e.g., status messages), which may comprise a plurality of bits (e.g., 64, 128, etc.). As an example, consider eight controllers each having two 128-bit wide status registers. In this example, each 128-bit wide status register might require 128 data paths from the register to a status aggregator and/or to a host. Accordingly, in this example, 2K data paths (128 per register×16 registers) would be required for providing the status information from the respective registers to the host. As described further herein, a number of embodiments of the present disclosure can provide the generated status information via fewer data paths as compared to previous approaches, such as in the example described above. For instance, a number of embodiments include time-division multiplexing the status information provided from respective status registers, which can reduce the number of data paths, among other benefits.

With respect to reducing latency associated with transferring status information, a number of embodiments of the present disclosure continuously poll status request signals provided from respective status registers. Such continuous polling improves latency as compared to approaches in which a component external to the controller (e.g., a status aggregator, host, etc.) may intermittently request status information from particular registers in a passive manner.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" a particular thing is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 430 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, memory array 130, sensing circuitry 150, logic circuitry 170, and/or status register 134 might also be separately considered an "apparatus."

System 100 includes a host 110 coupled to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, etc.).

The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines and/or select lines, and columns coupled by sense lines, which may be referred to herein as data lines and/or digit lines. Although a single array 130 is shown in FIG. 1, embodiments are not so limited. For instance, memory device 120 may include a number of arrays 130 (e.g., a number of banks of DRAM cells, NAND flash cells, etc.). Additionally, although not shown, a plurality of memory devices 120 can be coupled to host 110 via a respective plurality of memory channels.

The memory device 120 includes address circuitry 111 to latch address signals provided over a bus 156 through I/O circuitry 173. Bus 156 can serve as a data bus (e.g., an I/O bus) and as an address bus; however, embodiments are not so limited. Address signals can be received through address circuitry 111 and decoded by a row decoder 184 and a column decoder 185 to access the memory array 130. Status information, which can include exception information, can be provided from the controller 140 on the memory device 120 to host 110 through a status channel that includes a high speed interface (HSI), which can include an out-of-band bus 157. An out-of-band bus can refer to a bus separate from a data (e.g., DQ) bus. Data can be read from memory array 130 by sensing voltage and/or current changes on the data lines using sensing circuitry 150. The sensing circuitry 150 can read and latch a page (e.g., row) of data from the memory array 130. The I/O circuitry 173 can be used for bi-directional data communication with host 110 over the bus 156. The write circuitry 135 can be used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130, among other functions. For example, executing instructions from host 110 can include performing compute operations using processing resources corresponding to the sensing circuitry 150 and/or logic 170, as described further herein. The controller 140 can include a state machine (e.g., firmware and/or hardware in the form of an application specific integrated circuit (ASIC)), a sequencer, a control logic, and/or some other type of controlling circuitry. In the example shown in FIG. 1A, the controller 140 includes a register 134 (e.g., a status register), which may store status information in accordance with a number of embodiments described herein. A more detailed diagram of one example of controller 140 is described in association with FIG. 1B.

As described further below, in a number of embodiments, the sensing circuitry 150 can comprise a number of sense amplifiers and a number of compute components, which may serve as, and be referred to herein as an accumulator, and can be used to perform various compute operations (e.g., to perform logical operations on data associated with complementary sense lines). In a number of embodiments, storage locations (e.g., latches) corresponding to the compute components can serve as stages of a shift register. For example, clock signals can be applied to the compute components to shift data from one compute component to an adjacent compute component.

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute operations can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute operations using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150.

In a number of embodiments, the sensing circuitry 150 can be formed on pitch with the memory cells of the array. For example, the cells of memory array may have a particular cell size (e.g., $4F^2$ or $6F^2$, where "F" is a feature size corresponding to the cells). As described further below, in a number of embodiments, sensing components (e.g., respective sense amplifier and compute component pairs) corresponding to sensing circuitry 150 are formed on a same pitch as sense lines of the array and can be operated to perform various compute operations. For instance, if the sense line pitch is 3F, the transistors of the sensing components can fit within the same 3F pitch. In contrast, the devices (e.g., logic gates) associated with ALU circuitry of various previous processor-in-memory (PIM) systems may not be capable of being formed on pitch with the memory cells, which can increase chip size as compared to a number of embodiments of the present disclosure, for example. Additional logic circuitry 170 can be coupled to the sensing circuitry 150 and can be used to store (e.g., cache and/or buffer) results of operations described herein.

As such, in a number of embodiments, circuitry external to array 130 and sensing circuitry 150 is not needed to perform compute operations as the sensing circuitry 150 can be operated to perform various compute operations (e.g., logical operations associated with mathematical operations) without the use of an external processing resource. In a number of embodiments, the sensing circuitry 150 can be operated as a number of 1-bit processing resources, with the sensing components coupled to respective columns of the array 130 serving as respective 1-bit processing elements. Therefore, the sensing circuitry 150 may be used to complement and/or to replace, at least to some extent, an external processing resource such as ALU circuitry of a host.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register such as status register 134).

Figure 1B:
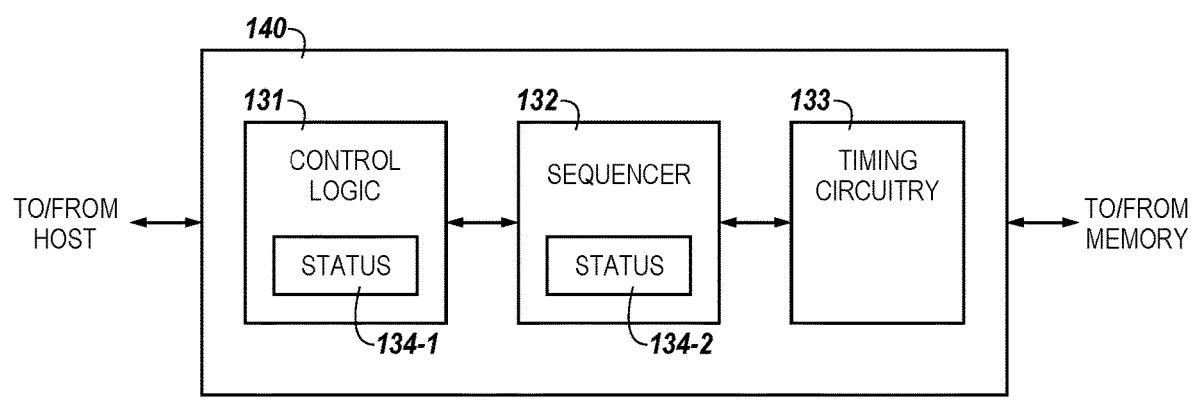
FIG. 1B is a block diagram in greater detail of an example of the controller shown in FIG. 1A in accordance with a number of embodiments of the present disclosure.

FIG. 1B is a block diagram in greater detail of an example of the controller 140 shown in FIG. 1A in accordance with a number of embodiments of the present disclosure. In the example shown in FIG. 1B, the controller 140 is shown comprising control logic 131, sequencer 132, and timing circuitry 133. The control logic 131 and the sequencer 132 can include status registers 134-1 and 134-2, respectively.

Although not shown in FIG. 1B, the control logic 131 can comprise a number of components (e.g., program counters, registers, ALUs, branching logic, state machines, etc.) configured to control fetching and executing instructions. For instance, microcode instructions can be fetched from a memory array (e.g., 130) and/or from a host (e.g., 110) and can be stored in a cache (e.g., of the controller) for execution. In a number of embodiments, the control logic 131 may decode microcode instructions for execution by sequencer 132. The sequencer 132 may also comprise a number of components (e.g., a number of FIFO buffers, program counter logic, branch logic, registers, microcode instruction cache, ALU, state machines, etc.) configured to execute microcode instructions. The timing circuitry 133 may provide timing to coordinate performance of the operations (e.g., memory operations and/or compute operations) and be responsible for providing conflict free access to the arrays such as array 130 in FIG. 1A.

In the example shown in FIG. 1B, the control logic 131 and the sequencer 132 include the respective status registers 134-1 and 134-2. The status registers 134-1 and/or 134-2 can store generated status information. As an example, the status information associated with register 134-1 may include status information related to program instructions, such as program counter state information, breakpoints, illegal instructions, etc., among various other exceptions. The status information associated with register 134-2 may include status information related to error conditions detected in microcode instructions, invalid circuit states, etc. The status information may also comprise control flow information and debug information, among other status information. The generated status information can be provided (e.g., reported) to a host (e.g., host 110) via a status channel such as described herein. For example, the status information within the status registers 134-1 and 134-2 can be routed to a host via a status arbiter (e.g., status arbiter 246 shown in FIG. 2B). In a number of embodiments, status signals corresponding to the respective status registers 134-1 and 134-2 are provided to the status arbiter. As described further below, the status signals can be continuously monitored (e.g., by the status arbiter) to determine whether a respective register contains generated status information to be reported.

Figure 2A:
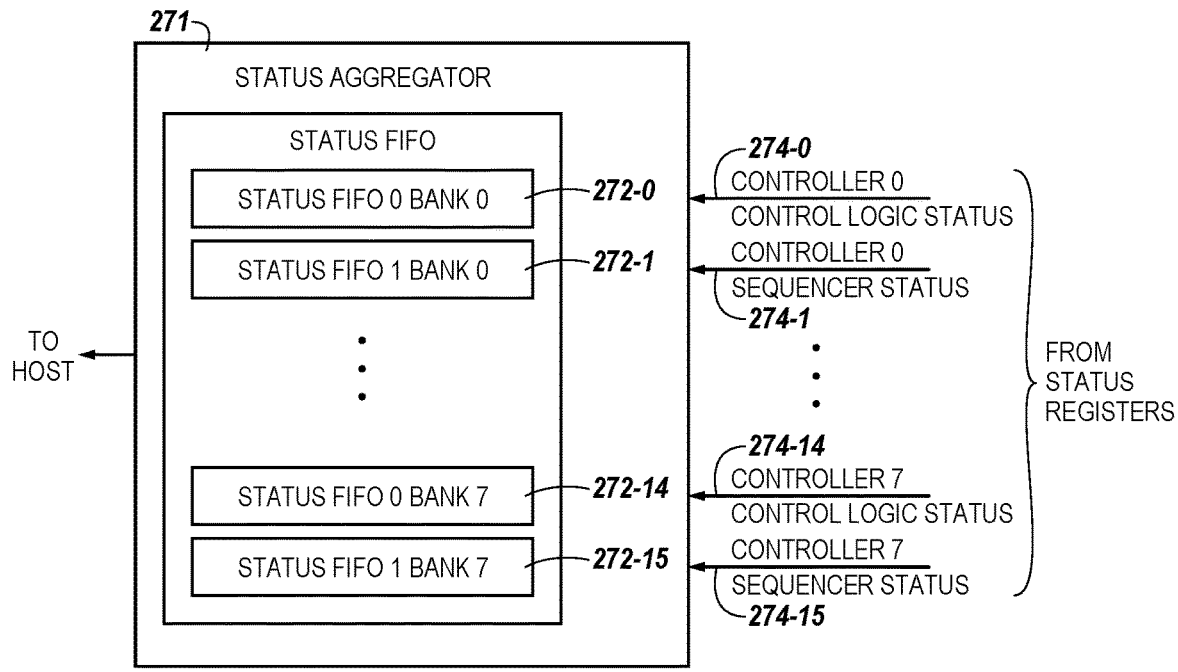
FIG. 2A illustrates a portion of a status channel.

FIG. 2A illustrates a portion of a status channel. The example shown in FIG. 2A includes a status aggregator 271. The status aggregator 271 can serve as an arbiter component, which can be configured to perform various functions such as coordinating commands performed on a plurality of memory banks and providing status information from a respective plurality of controllers corresponding to the banks. As used herein, a bank can comprise a controller (e.g., 140), a corresponding array of memory cells (e.g., 130), and various associated circuitry used to perform operations on the array. As an example, although the memory device 120 shown in FIG. 1A illustrates a single controller 140 and array 130 (e.g., a single bank), a memory device might comprise 4, 8, or 16 banks.

For instance, in the example shown in FIG. 2A, the status aggregator 271 is coupled to eight banks comprising respective controllers (e.g., CONTROLLER 0 through CONTROLLER 7). The controllers can be controllers such as controller 140 shown in FIG. 1B. As such, in this example, each of the eight controllers comprises two status registers (e.g., 134-1 and 134-2 shown in FIG. 1B) configured to store status information corresponding to the respective bank. For instance, each controller comprises a CONTROL LOGIC STATUS register and a SEQUENCER STATUS register. The status information can be provided from the status registers to the status aggregator 271 via respective data paths (e.g., 274-0, 274-1, . . . , 274-12, 274-15). The data paths 274-0 through 274-15 can be "N" bit data paths where N can represent a width of the respective status registers. For instance, if the status registers are 128 bit registers, then the data paths can each be 128 bit data paths (e.g., sixteen separate 128 bit busses). The status information from the plurality of status registers can be received by the aggregator 271 via a FIFO interface. For example, each controller can each have a pair of FIFOs coming into the status aggregator 271 for pushing the status information. The status aggregator 271 can pull the status information off each of the FIFOs and can push the status information back to the host (e.g., to host 110 via the out-of-band bus 156). Providing the status information to the host via an out-of-band bus can be desirable in order to prevent and/or reduce the memory bandwidth on the data bus (e.g., DQs).

In the example shown in FIG. 2A, the status aggregator 271 includes a status FIFO comprising a plurality of registers 272-0 (STATUS FIFO 0 BANK 0), 272-1 (STATUS FIFO 1 BANK 0), . . . , 272-14 (STATUS FIFO 0 BANK 7), 272-15 (STATUS FIFO 1 BANK 7) to temporarily store the status information pulled from the status registers of the controllers.

The example status channel described in association with FIG. 2A can provide an effective way of reporting status information from respective banks to a host. However, such a status channel may have drawbacks. For instance, providing a set of registers (e.g., 272-0 to 272-15) on an arbiter component (e.g., status aggregator 271) can increase the amount of logic associated with a system. As an example, for 128-bit wide status messages, 2K latches (128 bits×16) on the status aggregator 271 would be needed to store 16 status messages corresponding to the 16 respective status registers. Also, providing separate N-bit data paths (e.g., 274-0 through 274-15) for each separate N-bit status register can lead to increased signal routing complexity (e.g., as compared to the routing complexity described in association with the embodiment shown in FIG. 2B). Also, the status channel shown in FIG. 2A might rely on the status aggregator 271 monitoring (e.g., polling) the status registers of the controllers in a round-robin manner (e.g., periodically) to determine whether the respective status registers contain generated status information (e.g., error information, exception information, etc.) to be reported to the host. Polling of the status registers in this manner can lead to increased latency as compared to status channels in which the status registers are continuously monitored, for example.

Figure 2B:
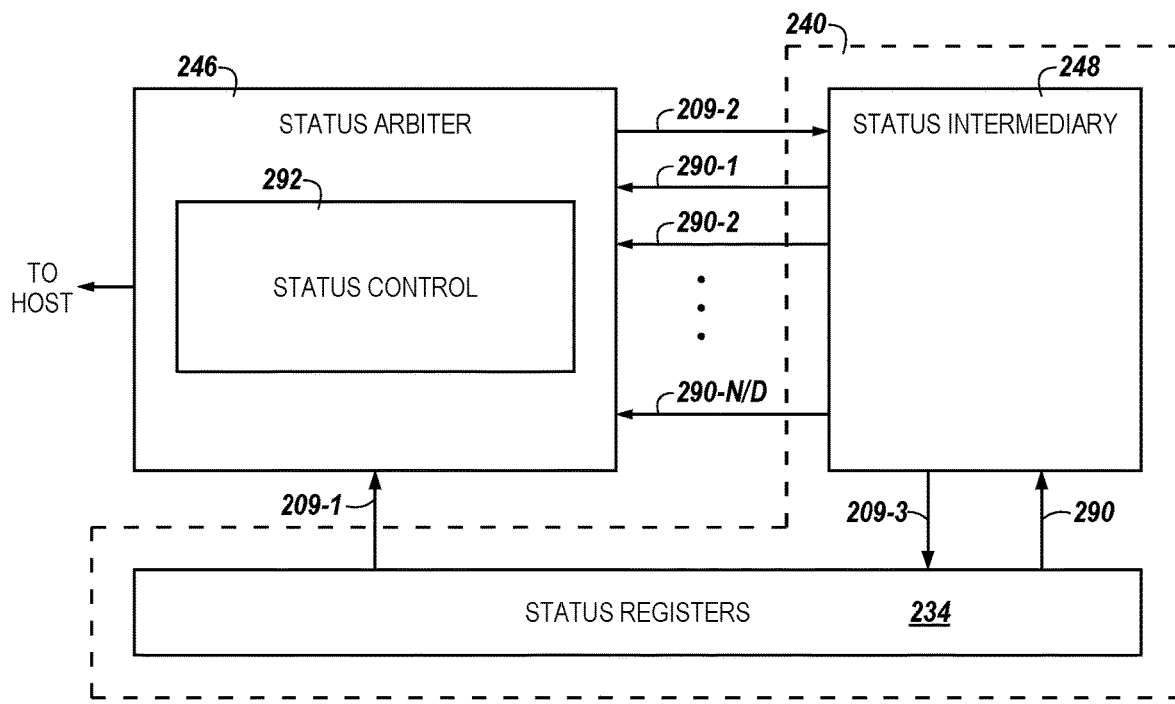
FIG. 2B is a block diagram illustrating a portion of a status channel in accordance with a number of embodiments of the present disclosure.

FIG. 2B is a block diagram illustrating a portion of a status channel in accordance with a number of embodiments of the present disclosure. Similar to the example shown in FIG. 2A, the example embodiment shown in FIG. 2B includes a status arbiter 246. Similar to the status aggregator 271, the status arbiter 246 can serve as an arbiter component, which can be configured to perform various functions such as coordinating commands performed on a plurality of memory banks and providing status information from a respective plurality of controllers (e.g., 240) corresponding to the banks.

The status channel shown in FIG. 2B includes a number of registers 234 local to (e.g., resident on) the controller 240. The controller 240 can be a controller such as controller 140 described in FIGS. 1A and 1B. In a number of embodiments, the controller 240 includes a status intermediary 248 configured to provide generated status information from the registers 234 to the status arbiter 246. In this example, controller 240 represents multiple controllers coupled to the status arbiter 246, and each controller can have a respective status intermediary 248 associated therewith. Although only one controller is shown in FIG. 2B, Unlike the status channel in FIG. 2A, the status arbiter 246 does not include a status FIFO comprising a plurality of registers (e.g., 272-0 through 272-15) to temporarily store the status information pulled from the status registers 234 of the controllers 240. In contrast, the status arbiter 246 includes a status control component 292 configured to provide status information received from the status registers 234 (e.g., via status intermediary 248) to a host (e.g., host 110 shown in FIG. 1A). The status control component 292 can be, for example, a state machine (e.g., such as state machine 392 shown in FIG. 3) and/or some other type of control circuitry. Providing a status arbiter 246 that does not include separate status FIFO registers can reduce the size and/or circuitry complexity of a system, among other benefits. Further detail regarding the status arbiter 246 and its operation in association with reporting generated status information from status registers to a host is described in further detail in association with FIG. 3.

In the example shown in FIG. 2B, a status request signal 209-1 corresponding to each of the respective status registers 234 is provided from the controller 240 to the status arbiter 246. As an example, if a memory device includes 16 status registers, then signal 209-1 can represent 16 status request signals provided to the status arbiter 246. The status request signals 209-1 can be flags, which can be "set" to indicate that the corresponding register contains generated status information to be provided to the host. In a number of embodiments, once the status flags are set, they remain set until serviced (e.g., until the corresponding status information has been successfully provided to the host). In the embodiment shown in FIG. 2B, the status request signals 209-1 can be continuously monitored (e.g., via continuous polling by status control component 292), which can reduce latency associated with servicing status requests as compared to examples such as described in FIG. 2A, which may involve passively monitoring status registers (e.g., via periodic polling).

The status control component 292 can be configured to monitor the status request signals 209-1 and determine an order in which the status requests are to be serviced (e.g., in the event that multiple status registers contain generated status information to be reported). For instance, in the embodiment illustrated in FIG. 2B, responsive to a status request signal 209-1 indicating that a corresponding status register 234 contains generated status information, the status control component 292 can provide a grant signal 209-2 to the status intermediary 248 indicating which status register 234 is granted permission for providing its status information. Responsive to the grant signal 209-2, the status intermediary can provide a signal 209-3 to the control component corresponding to the selected status register 234 indicating that the generated status information can be provided to the status intermediary 248 (e.g., as indicated by arrow 290).

In a number of embodiments, the status intermediary 248 is configured to time division multiplex the N-bit status information (e.g., message) received from the status registers 234 such that the status information is provided to the status arbiter 246 in multiple data transfers over fewer than N data paths. For instance, in the example shown in FIG. 2B, the N-bit status information is provided to the status arbiter 246 over "N/D" data paths (e.g., 290-1, 290-2, . . . , 290-(N/D)), where "N/D" is a positive integer less than "N". As an example, for 128-bit status messages (e.g., N=128), N/D might be 8 (e.g., D=16) or N/D might be 16 (e.g., D=8). In a number of embodiments, each respective status register 234 can be associated with a different N/D data paths (e.g., 290-1 to 290-(N/D)). For instance, if there are 16 status registers 234 each configured to store 128-bit status messages (e.g., N=128) and D is 16 such that N/D is 8, then each status register 234 might be associated with 8 data paths between the status intermediary 248 and the status arbiter 246. In this particular example, providing all 128-bits of a particular status message over an 8-bit data path, via time-division multiplexing, would involve 16 data transfers over the 8-bit data path (e.g., 128 bits/8-bit data path=16 transfers of 8 different bits). Embodiments are not limited to a particular number of data paths between the status intermediary 248 and the status arbiter 246.

Performing time-division multiplexing in accordance with a number of embodiments of the present disclosure can provide various benefits. For instance, time-division multiplexing the status messages as described above can significantly reduce the quantity of data paths between a controller(s) (e.g., 240) and a status arbiter (e.g., 246). For instance, for 16 128-bit wide status registers, providing 8-bit data paths per register (e.g., N/D=8) rather than 128-bit data paths would reduce the quantity of routes from 2K (e.g., 128×16) to 128 (e.g., 8×16).

In a number of embodiments, and as shown in FIG. 2B, the status intermediary 248 can be local to a controller 240. For example, if a memory device includes 8 controllers (e.g., controller 140 shown in FIG. 1B) each comprising two status registers (e.g., 16 registers in the memory device), the memory device can also include 8 status intermediaries corresponding to a respective pair of status registers and local to a respective controller 240. However, embodiments are not so limited. For example, the status intermediary 248 may be located outside of the controller 240 and still be configured to individually correspond to status registers of a particular controller.

Figure 3:
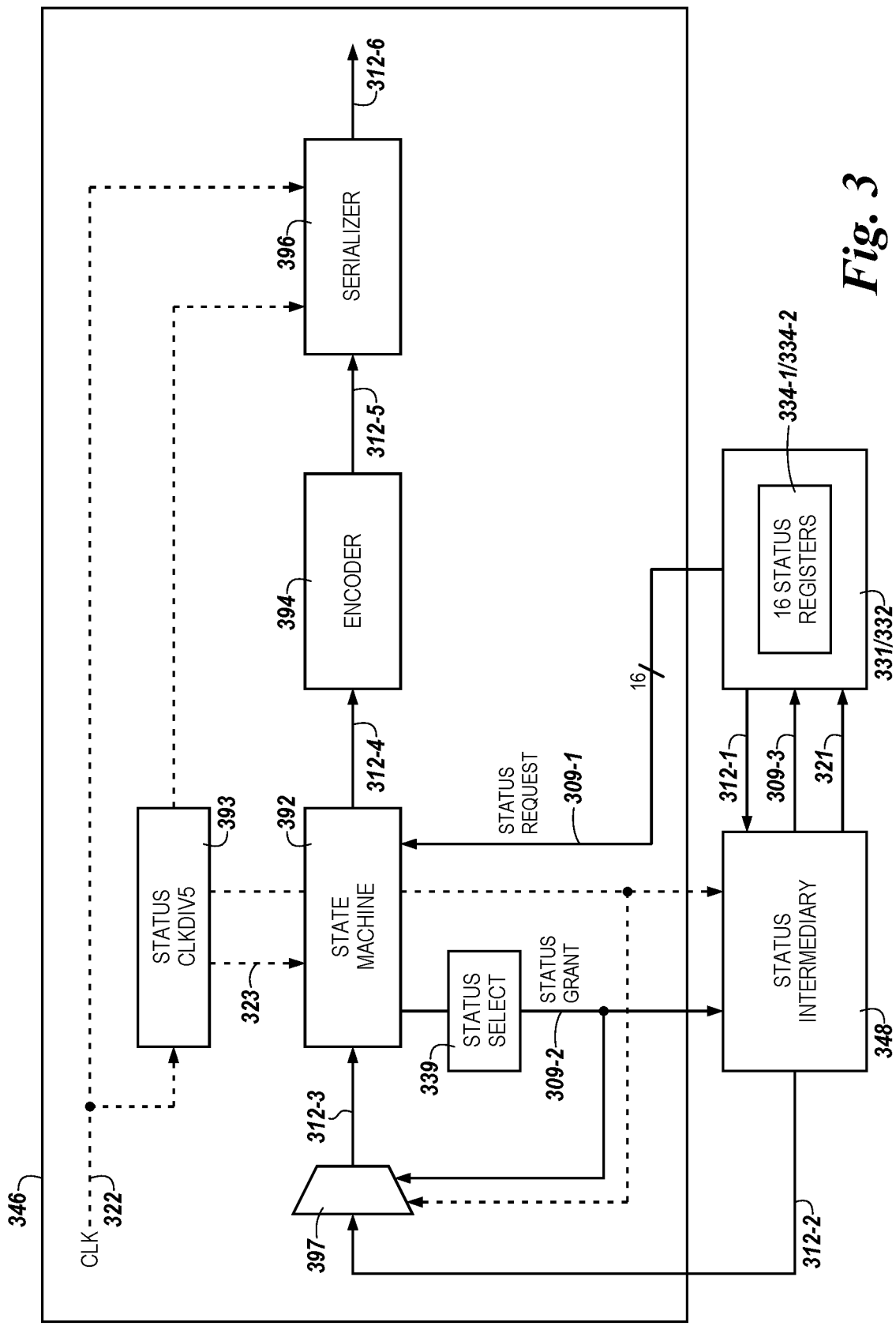
FIG. 3 is a block diagram illustrating additional detail of the portion of the status channel shown in FIG. 2B.

FIG. 3 is a block diagram illustrating additional detail of the portion of the status channel shown in FIG. 2B. The status arbiter 346, status intermediary 348, and status registers 334-1/334-2 can be analogous to the respective status arbiter 246, status intermediary 248, and status registers 234 shown in FIG. 2B. The example shown in FIG. 3 includes 16 status registers 334-1/334-2 (e.g., status registers 134-1 and 134-2) corresponding to control components 331/332, which can be analogous to the control components 131 (e.g., CONTROL LOGIC) and 132 (e.g., SEQUENCER) shown in FIG. 1B. Embodiments are not limited to a particular quantity of status registers 334-1/334-2 and/or control components 331/332.

As an example, the 16 status registers 334-1/334-2 can correspond to eight controllers (e.g., two registers per controller 140 as shown in FIG. 1B). Although a single status intermediary 348 is shown, there may be a plurality of status intermediaries 348 corresponding to respective controllers (e.g., controllers comprising the control components 331/332).

As shown in FIG. 3, the status arbiter 346 includes a status control component 392 (e.g., STATE MACHINE), which can be analogous to the status control component described in FIG. 2B. As described above, in operation, status request signals 309-1 corresponding to the respective status registers 334-1/334-2 are actively monitored (e.g., continuously polled) by the status state machine 392. In this example, there are 16 status request signals 309-1 corresponding to the 16 status registers 334-1/334-2. The control components 331/332 can generate status information that is stored in corresponding status registers 334-1/334-2. The status request signals 309-1 are configured to provide an indication to the status state machine 392 when a corresponding status register 334-1/334-2 contains generated status information. The status request signals 309-1 can be flags or interrupt signals, among other types of signals used to indicate that a corresponding status register contains status information to be reported.

The status arbiter 346 can include a status select 339 that can be configured to control the timing of when a status signal 309-1 is serviced. For instance, the status select 339 can select from among a number of received status request signals 309-1 (e.g., in the event that multiple status request signals are "set" concurrently). The status select 339 can provide a status grant signal 309-2 to the status intermediary 348 to indicate from which status register 334-1/334-2 status information is to be provided. Responsive to receiving the status grant signal 309-2, the status intermediary 348 can provide a signal 309-3 to the corresponding control component 331/332 indicating that the corresponding generated status information can be sent (e.g., to the status intermediary 348). Responsive to the controller receiving signal 309-3, the status information of the selected status register is sent to the corresponding status intermediary (e.g., as indicated by arrow 312-1). For purposes of discussion, it will be assumed that the status registers 334-1/334-2 are 128-bit wide registers (e.g., to store 128-bit wide status messages); however, embodiments are not so limited.

As indicated by arrow 312-2, the status intermediary 348 is configured to provide (e.g., send) the selected status information to the status arbiter 346. As described above, the status intermediary 348 can be configured to perform time-division multiplexing on the status information received from the selected status register 334-1/334-2. As an example, for 128-bit status messages, the status intermediary might be configured to perform 16 separate 8-bit data transfers to provide a selected status message to the status arbiter 346. In this example, arrow 312-2 might represent a plurality of 8-bit wide busses (e.g., one 8-bit wide bus for each of the 16 128-bit wide status registers). A multiplexer 397 can be used to select the particular one of the 16 8-bit wide busses (e.g., to select the bus corresponding to the selected status register) to be input to the state machine 392 (e.g., as shown by arrow 312-3). As shown by arrow 312-4, the data output from the state machine 392 can be encoded (e.g., via encoder 394). The encoding can be, for example, an 8b/10b encoding, among various other encodings that can provide suitable DC-balance and/or clock recovery. As shown by arrow 312-5, the encoded data can be output from encoder 394 (e.g., in a parallel manner) and serialized via a data serializer 396. The signal 312-6 can represent the serialized data output from the status arbiter 346 and provided to the host (e.g., via an out-of-band bus).

The status intermediary 348 can also send a signal 321 to the corresponding control component 331/332 to update the selected status register 334-1/334-2. As an example, the signal 321 can be a "pop" signal or a signal to clear the selected status register, which can also result in resetting the status request signal 309-1 corresponding to the selected status register 334-1/334-2.

As an alternative, arrow 312-2 can represent a "wire ORed" bus. For example, arrow 312-1 can represent 16 128-bit busses (corresponding to the 16 respective 128-bit registers 334-1/334-2). In this example, the bus 312-2 can be a 128-bit bus selectively driven by a particular status register 334-1/334-2. For instance, a "wired OR" configuration may be used (e.g., by the status intermediary 348) to select which one of the 16 128-bit busses corresponding to arrow 312-1 drives the bus corresponding to arrow 312-2. In this manner, the 128-bits of a selected status message would be provided, in parallel, to the status arbiter 346 and multiplexer 397 would not be needed. In this example, the status select 339 can be used to select which of the status registers 334-1/334-2 is allowed to drive the bus 312-2.

In the example illustrated in FIG. 3, a clock signal 322 (CLK) is provided to the status arbiter 346. The clock signal 322 can be, for example, a DDR interface clock, among other types of clock signals. The example of FIG. 3 includes a clock modification component 393 (STATUS CLKDIV5) that receives the clock signal 322 and outputs a modified clock signal 323. The modified clock signal 323 can have a frequency that is a particular fraction (e.g., ½, ¼, ⅕, etc.) of the clock signal 322, for example. The amount of modification associated with modified clock signal 323 can depend on various factors. For example, in a number of embodiments, the status intermediary 348 may be configured such that it can only output 8-bits every five clock cycles of clock signal 322. Accordingly, it can be beneficial to provide the status intermediary 348 with a clock signal 323 having a clock cycle time five times longer than clock signal 322. The clock signal 322 and modified clock signal 323 can be provided to various components associated with the status channel shown in FIG. 3.

In a number of embodiments, the generated status information can be provided from the status registers (e.g., 334-1/334-2) to the host via an inband bus such as data bus 156 shown in FIG. 1A. For instance, an alert signal corresponding to the 16 status registers can be provided to the host (e.g., via an alert pin). The alert signal can be, for example, an OR of the 16 status request signals 309-1. In such an implementation, the alert signal would be active responsive to any of the status request signals 309-1 being set. Responsive to the alert signal being active, the host could poll the status registers 334-1/334-2 to determine which status register(s) contains status information to be reported. After reading a particular status register 334-1/334-2, the read status register can be updated (e.g., cleared) and the alert signal can be deactivated (e.g., reset), assuming none of the status registers contains status information yet to be reported. As an example, in-band access to the status registers 334-1/334-2 can be accomplished via DMA (direct memory access) read commands. In-band access (e.g., access via an in-band data bus) can provide access to status information, by a host for example, which may not support out-of-band access (e.g., via additional pins). Additionally, in a number of embodiments, a dedicated alert pin, which may be used for the alert signal, may not be needed in association with in-band access. For instance, a host could be configured to periodically poll the status registers 334-1/334-2 rather than continuously polling via an alert signal.

Figure 4:
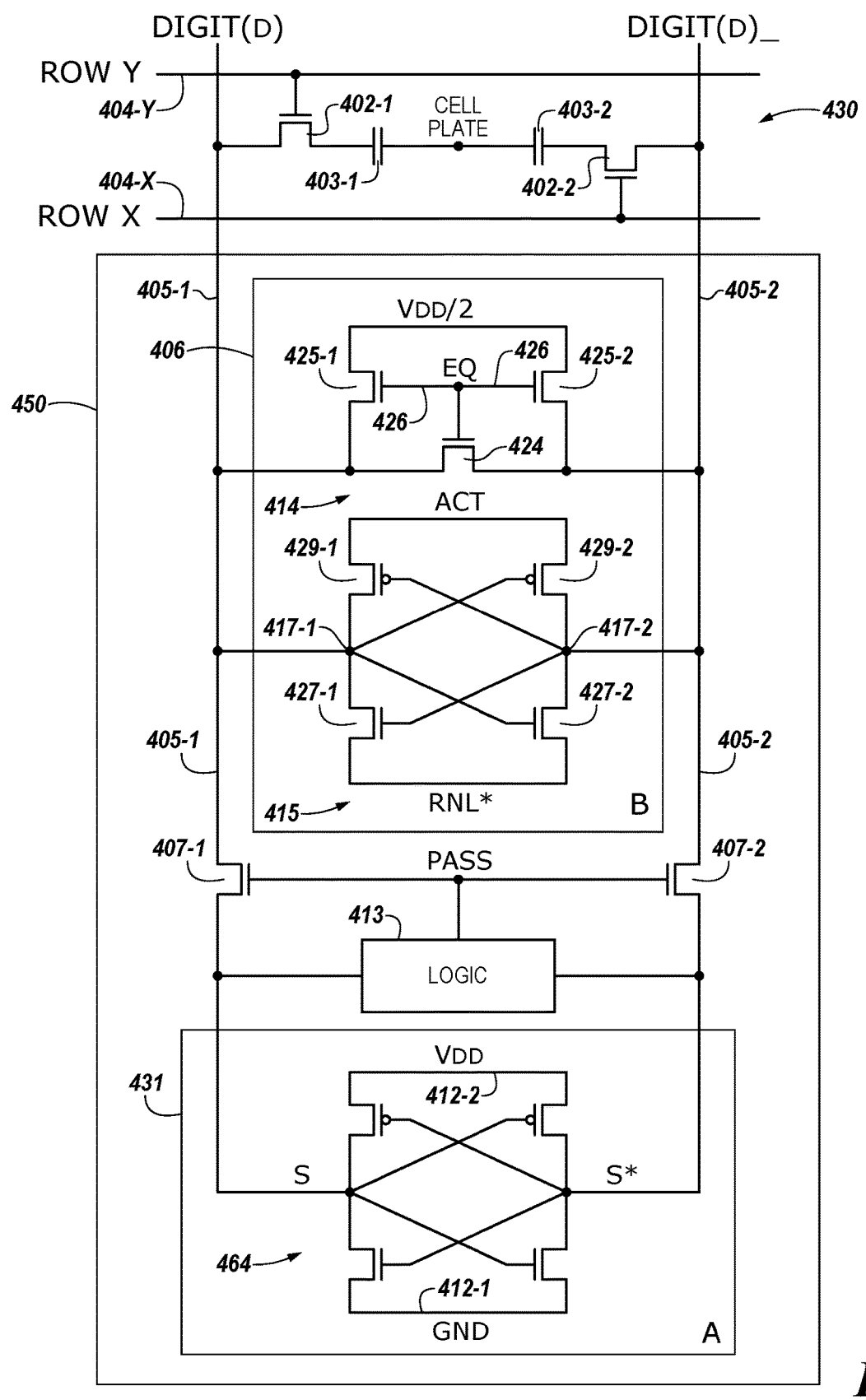
FIG. 4 is a schematic diagram illustrating sensing circuitry in accordance with a number of embodiments of the present disclosure.

FIG. 4 is a schematic diagram illustrating sensing circuitry 450 in accordance with a number of embodiments of the present disclosure. The sensing circuitry 450 can correspond to sensing circuitry 150 shown in FIG. 1. In the example shown in FIG. 4, a memory cell includes a storage element (e.g., capacitor) and an access device (e.g., transistor). For instance, a first memory cell includes transistor 402-1 and capacitor 403-1, and a second memory cell can include transistor 402-2 and capacitor 403-2, etc. In this embodiment, the memory array 430 is a DRAM array of 1T1C (one transistor one capacitor) memory cells, although other cell configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 5:
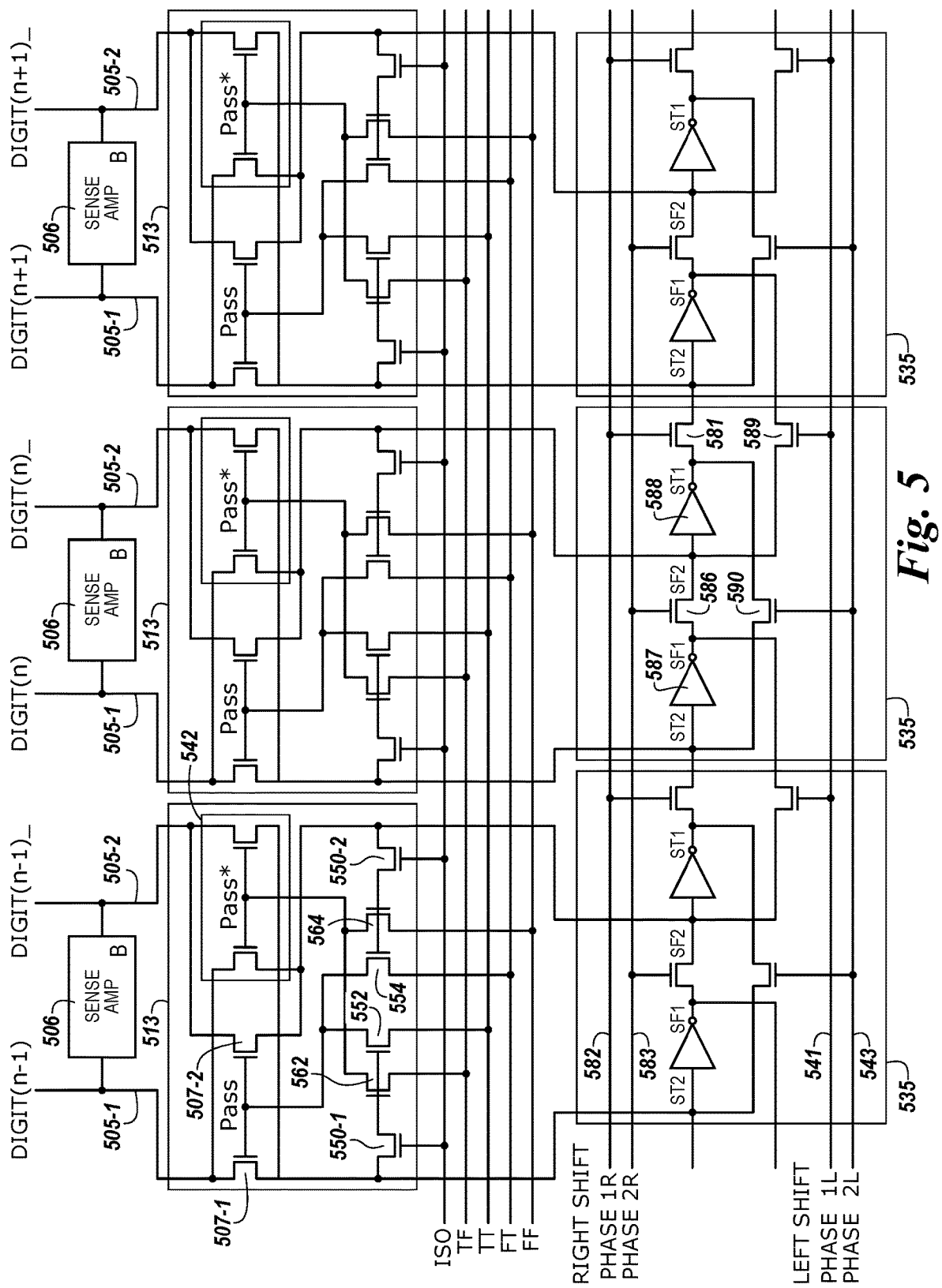
FIG. 5 is a schematic diagram illustrating sensing circuitry in accordance with a number of embodiments of the present disclosure.

The cells of the memory array 430 can be arranged in rows coupled by access (word) lines 404-X (ROW X), 404-Y (ROW Y), etc., and columns coupled by pairs of complementary sense lines (e.g., digit lines DIGIT(D) and DIGIT(D)_ shown in FIG. 4 and DIGIT_(n) and DIGIT(n)_ shown in FIG. 5). The individual sense lines corresponding to each pair of complementary sense lines can also be referred to as digit lines 405-1 for DIGIT (D) and 405-2 for DIGIT (D)_, respectively. Although only one pair of complementary digit lines are shown in FIG. 4, embodiments of the present disclosure are not so limited, and an array of memory cells can include additional columns of memory cells and digit lines (e.g., 4,096, 8,192, 16,384, etc.).

Although rows and columns are illustrated as being orthogonal to each other, embodiments are not so limited. For example, the rows and columns may be oriented relative to each other in various other two-dimensional or three-dimensional configurations.

Memory cells can be coupled to different digit lines and word lines. For example, a first source/drain region of a transistor 402-1 can be coupled to digit line 405-1 (D), a second source/drain region of transistor 402-1 can be coupled to capacitor 403-1, and a gate of a transistor 402-1 can be coupled to word line 404-Y. A first source/drain region of a transistor 402-2 can be coupled to digit line 405-2 (D)_, a second source/drain region of transistor 402-2 can be coupled to capacitor 403-2, and a gate of a transistor 402-2 can be coupled to word line 404-X. A cell plate, as shown in FIG. 4, can be coupled to each of capacitors 403-1 and 403-2. The cell plate can be a common node to which a reference voltage (e.g., ground) can be applied in various memory array configurations.

The memory array 430 is configured to couple to sensing circuitry 450 in accordance with a number of embodiments of the present disclosure. In this embodiment, the sensing circuitry 450 comprises a sense amplifier 406 and a compute component 431 corresponding to respective columns of memory cells (e.g., coupled to respective pairs of complementary digit lines). The sense amplifier 406 can be coupled to the pair of complementary digit lines 405-1 and 405-2. The compute component 431 can be coupled to the sense amplifier 406 via pass gates 407-1 and 407-2. The gates of the pass gates 407-1 and 407-2 can be coupled to operation selection logic 413.

The operation selection logic 413 can be configured to include pass gate logic for controlling pass gates that couple the pair of complementary digit lines un-transposed between the sense amplifier 406 and the compute component 431 and swap gate logic for controlling swap gates that couple the pair of complementary digit lines transposed between the sense amplifier 406 and the compute component 431. The operation selection logic 413 can also be coupled to the pair of complementary digit lines 405-1 and 405-2. The operation selection logic 413 can be configured to control pass gates 407-1 and 407-2 based on a selected operation.

The sense amplifier 406 can be operated to determine a data value (e.g., logic state) stored in a selected memory cell. The sense amplifier 406 can comprise a cross coupled latch, which can be referred to herein as a primary latch. In the example illustrated in FIG. 4, the circuitry corresponding to sense amplifier 406 comprises a latch 415 including four transistors coupled to a pair of complementary digit lines 405-1 and 405-2. However, embodiments are not limited to this example. The latch 415 can be a cross coupled latch (e.g., gates of a pair of transistors) such as n-channel transistors (e.g., NMOS transistors) 427-1 and 427-2 are cross coupled with the gates of another pair of transistors, such as p-channel transistors (e.g., PMOS transistors) 429-1 and 429-2).

In operation, when a memory cell is being sensed (e.g., read), the voltage on one of the digit lines 405-1 (D) or 405-2 (D)_ will be slightly greater than the voltage on the other one of digit lines 405-1 (D) or 405-2 (D)_. An ACT signal can be driven high and an RNL* signal can be driven low to enable (e.g., fire) the sense amplifier 406. The digit lines 405-1 (D) or 405-2 (D)_ having the lower voltage will turn on one of the PMOS transistor 429-1 or 429-2 to a greater extent than the other of PMOS transistor 429-1 or 429-2, thereby driving high the digit line 405-1 (D) or 405-2 (D)_ having the higher voltage to a greater extent than the other digit line 405-1 (D) or 405-2 (D)_ is driven high.

Similarly, the digit line 405-1 (D) or 405-2 (D)_ having the higher voltage will turn on one of the NMOS transistor 427-1 or 427-2 to a greater extent than the other of the NMOS transistor 427-1 or 427-2, thereby driving low the digit line 405-1 (D) or 405-2 (D)_ having the lower voltage to a greater extent than the other digit line 405-1 (D) or 405-2 (D)_ is driven low. As a result, after a short delay, the digit line 405-1 (D) or 405-2 (D)_ having the slightly greater voltage is driven to the voltage of the supply voltage $V_{DD}$ through a source transistor, and the other digit line 405-1 (D) or 405-2 (D)_ is driven to the voltage of the reference voltage (e.g., ground) through a sink transistor. Therefore, the cross coupled NMOS transistors 427-1 and 427-2 and PMOS transistors 429-1 and 429-2 serve as a sense amplifier pair, which amplify the differential voltage on the digit lines 405-1 (D) and 405-2 (D)_ and operate to latch a data value sensed from the selected memory cell.

Embodiments are not limited to the sense amplifier 406 configuration illustrated in FIG. 4. As an example, the sense amplifier 406 can be a current-mode sense amplifier and a single-ended sense amplifier (e.g., sense amplifier coupled to one digit line). Also, embodiments of the present disclosure are not limited to a folded digit line architecture such as that shown in FIG. 4.

The sense amplifier 406 can, in conjunction with the compute component 431, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations using less power than various previous approaches. Additionally, since a number of embodiments eliminate the need to transfer data across local and global I/O lines and/or external data buses in order to perform compute operations (e.g., between memory and discrete processor), a number of embodiments can enable an increased (e.g., faster) processing capability as compared to previous approaches.

The sense amplifier 406 can further include equilibration circuitry 414, which can be configured to equilibrate the digit lines 405-1 (D) and 405-2 (D)_. In this example, the equilibration circuitry 414 comprises a transistor 424 coupled between digit lines 405-1 (D) and 405-2 (D)_. The equilibration circuitry 414 also comprises transistors 425-1 and 425-2 each having a first source/drain region coupled to an equilibration voltage (e.g., $V_{DD}/2$), where $V_{DD}$ is a supply voltage associated with the array. A second source/drain region of transistor 425-1 can be coupled digit line 405-1 (D), and a second source/drain region of transistor 425-2 can be coupled digit line 405-2 (D)_. Gates of transistors 424, 425-1, and 425-2 can be coupled together, and to an equilibration (EQ) control signal line 426. As such, activating EQ enables the transistors 424, 425-1, and 425-2, which effectively shorts digit lines 405-1 (D) and 405-2 (D)_ together and to the equilibration voltage (e.g., $V_{DD}/2$).

As described further below, in a number of embodiments, the sensing circuitry 450 (e.g., sense amplifier 406 and compute component 431) can be operated to perform a selected operation and initially store the result in one of the sense amplifier 406 or the compute component 431 without transferring data from the sensing circuitry via a local or global I/O line (e.g., without performing a sense line address access via activation of a column decode signal, for instance).

As shown in FIG. 4, the compute component 431 can also comprise a latch, which can be referred to herein as a secondary latch 464. The secondary latch 464 can be configured and operated in a manner similar to that described above with respect to the primary latch 415, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 431 is not limited to that shown in FIG. 4, and various other embodiments are feasible.

FIG. 5 is a schematic diagram illustrating sensing circuitry in accordance with a number of embodiments of the present disclosure. FIG. 5 illustrates a number of columns of an array each comprising a pair of complementary sense lines 505-1 and 505-2 coupled to a corresponding sense amplifier 506 and a compute component 535. The compute components 535 can be coupled to the sense amplifiers 506 via pass gates 507-1 and 507-2. The sense amplifiers 506 shown in FIG. 5 can correspond to sense amplifier 406 shown in FIG. 4. The sensing circuitry shown in FIG. 5 can correspond to sensing circuitry 150 shown in FIG. 1A, for example. The logical operation selection logic 513 shown in FIG. 5 can correspond to logical operation selection logic 413 shown in FIG. 4.

The gates of the pass gates 507-1 and 507-2 can be controlled by a logical operation selection logic signal, Pass. For example, an output of the logical operation selection logic can be coupled to the gates of the pass gates 507-1 and 507-2. The compute components 535 can latch respective data values, and can be operated as a shift register via shifting of the data values (e.g., right and/or left).

As an example, the compute components 535 can comprise respective stages (e.g., shift cells) of a shift register configured to shift data values left and/or right. For example, as illustrated in FIG. 5, each compute component 535 (e.g., stage) of the shift register comprises a pair of right-shift transistors 581 and 586, a pair of left-shift transistors 589 and 590, and a pair of inverters 587 and 588. The signals PHASE 1R, PHASE 2R, PHASE 1L, and PHASE 2L can be applied to respective control lines 582, 583, 541 and 543 to enable/disable feedback on the latches of the corresponding compute components 535 in association with performing logical operations and/or shifting data in accordance with embodiments described herein.

The sensing circuitry shown in FIG. 5 also shows a logical operation selection logic 513 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 505-1 and 505-2 when the isolation transistors 550-1 and 550-2 are enabled via the ISO control signal being asserted.

According to various embodiments, the logical operation selection logic 513 can include four logic selection transistors: logic selection transistor 562 coupled between the gates of the swap transistors 542 and a TF signal control line, logic selection transistor 552 coupled between the gates of the pass gates 507-1 and 507-2 and a TT signal control line, logic selection transistor 554 coupled between the gates of the pass gates 507-1 and 507-2 and a FT signal control line, and logic selection transistor 564 coupled between the gates of the swap transistors 542 and a FF signal control line. Gates of logic selection transistors 562 and 552 are coupled to the true sense line through isolation transistor 550-1 (having a gate coupled to an ISO signal control line). Gates of logic selection transistors 564 and 554 are coupled to the complementary sense line through isolation transistor 550-2 (also having a gate coupled to an ISO signal control line).

Data values present on the pair of complementary sense lines 505-1 and 505-2 can be loaded into the compute component 535 via the pass gates 507-1 and 507-2. When the pass gates 507-1 and 507-2 are OPEN (e.g., conducting), data values on the pair of complementary sense lines 505-1 and 505-2 are passed to the compute components 535 (e.g., loaded into the shift register). The data values on the pair of complementary sense lines 505-1 and 505-2 can be the data value stored in the sense amplifier 506 when the sense amplifier is fired. The logical operation selection logic signal, Pass, is high to OPEN the pass gates 507-1 and 507-2.

The ISO, TF, TT, FT, and FF control signals can operate to select a logical function to implement based on the data value ("B") in the sense amplifier 506 and the data value ("A") in the compute component 535. In particular, the ISO, TF, TT, FT, and FF control signals are configured to select the logical function to implement independent from the data value present on the pair of complementary sense lines 505-1 and 505-2 (although the result of the implemented logical operation can be dependent on the data value present on the pair of complementary sense lines 505-1 and 505-2. That is, the ISO, TF, TT, FT, and FF control signals select the logical operation to implement directly since the data value present on the pair of complementary sense lines 505-1 and 505-2 is not passed through logic to operate the gates of the pass gates 507-1 and 507-2.

Additionally, FIG. 5 shows swap transistors 542 configured to swap the orientation of the pair of complementary sense lines 505-1 and 505-2 between the sense amplifier 506 and the compute component 535. When the swap transistors 542 are OPEN, data values on the pair of complementary sense lines 505-1 and 505-2 on the sense amplifier 506 side of the swap transistors 542 are oppositely-coupled to the pair of complementary sense lines 505-1 and 505-2 on the compute component 535 side of the swap transistors 542, and thereby loaded into the loadable shift register of the compute component 535.

The logical operation selection logic signal Pass can be activated (e.g., high) to OPEN the pass gates 507-1 and 507-2 when the ISO control signal line is activated and either the TT control signal is activated (e.g., high) and data value on the true sense line is "1" or the FT control signal is activated (e.g., high) and the data value on the complement sense line is "1."

The data value on the true sense line being a "1" OPENs logic selection transistors 552 and 562. The data value on the complementary sense line being a "1" OPENs logic selection transistors 554 and 564. If the ISO control signal or either the respective TT/FT control signal or the data value on the corresponding sense line (e.g., sense line to which the gate of the particular logic selection transistor is coupled) is not high, then the pass gates 507-1 and 507-2 will not be OPENed by a particular logic selection transistor.

The logical operation selection logic signal Pass* can be activated (e.g., high) to OPEN the swap transistors 542 (e.g., conducting) when the ISO control signal line is activated and either the TF control signal is activated (e.g., high) and data value on the true sense line is "1," or the FF control signal is activated (e.g., high) and the data value on the complement sense line is "1." If either the respective control signal or the data value on the corresponding sense line (e.g., sense line to which the gate of the particular logic selection transistor is coupled) is not high, then the swap transistors 542 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together.

The sensing circuitry illustrated in FIG. 5 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 507-1 and 507-2 and swap transistors 542 to be OPEN at the same time, which shorts the pair of complementary sense lines 505-1 and 505-2 together. According to a number of embodiments of the present disclosure, the logical operations which can be implemented by the sensing circuitry illustrated in FIG. 5 can be the logical operations summarized in the logic tables shown in FIG. 6.

Figure 6:
FIG. 6 is a logic table illustrating selectable logic operation results that can be implemented by sensing circuitry such as that shown in FIG. 5 in accordance with a number of embodiments of the present disclosure.

FIG. 6 is a logic table illustrating selectable logic operation results that can be implemented by sensing circuitry such as that shown in FIG. 5 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 506 and compute component 535. The four control signals, in conjunction with a particular data value present on the complementary sense lines, controls the states of the pass gates 507-1 and 507-2 and swap transistors 542, which in turn affects the data value in the compute component 535 and/or sense amplifier 506 before/after firing. The capability to selectably control states of the swap transistors 542 facilitates implementing logical operations involving inverse data values (e.g., inverse operands and/or inverse result), among others.

Logic Table 6-1 illustrated in FIG. 6 shows the starting data value ("A") stored in the compute component 535 shown in column 644, and the starting data value ("B") stored in the sense amplifier 506 shown in column 645. The other 3 column headings in Logic Table 6-1 refer to the states of the pass gates 507-1 and 507-2, and the swap transistors 542, which can respectively be controlled to be OPEN (e.g., conducting) or CLOSED (e.g., not conducting) depending on the state of the four logic selection control signals (e.g., TF, TT, FT, and FF), in conjunction with a particular data value present on the pair of complementary sense lines 505-1 and 505-2. The "NOT OPEN" column corresponds to the pass gates 507-1 and 507-2 and the swap transistors 542 both being in a non-conducting condition, the "OPEN TRUE" corresponds to the pass gates 507-1 and 507-2 being in a conducting condition, and the "OPEN INVERT" corresponds to the swap transistors 542 being in a conducting condition. The configuration corresponding to the pass gates 507-1 and 507-2 and the swap transistors 542 both being in a conducting condition is not reflected in Logic Table 6-1 since this results in the sense lines being shorted together.

Via selective control of the pass gates 507-1 and 507-2 and the swap transistors 542, each of the three columns of the upper portion of Logic Table 6-1 can be combined with each of the three columns of the lower portion of Logic Table 6-1 to provide 3×3=9 different result combinations, corresponding to nine different logical operations, as indicated by the various connecting paths shown at 675. The nine different selectable logical operations that can be implemented by the sensing circuitry, e.g., 150 in FIG. 1A, are summarized in Logic Table 6-2 illustrated in FIG. 6, including an XOR logical operation.

The columns of Logic Table 6-2 illustrated in FIG. 6 show a heading 680 that includes the state of the logic selection control signals (FF, FT, TF and TT). For example, the state of a first logic selection control signal is provided in row 676, the state of a second logic selection control signal is provided in row 677, the state of a third logic selection control signal is provided in row 678, and the state of a fourth logic selection control signal is provided in row 679. The particular logical operation corresponding to the results is summarized in row 647.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a controller comprising a status intermediary and a status register, the controller configured to:
responsive to receiving a status grant signal from a status arbiter, time-division multiplex, at the status intermediary, requested status information received from the status register, wherein:
the status grant signal is received in response to providing a status signal to the status arbiter indicating that the status register of the controller contains the status information comprising N bits, wherein N is a positive integer greater than one; and
provide the status information in a time-division multiplexed form to the status arbiter over fewer than N data paths.

2. The apparatus of claim 1, wherein the controller is configured to provide, to the status arbiter, the status signal as an interrupt request signal.

3. The apparatus of claim 1, wherein the controller includes a sequencer and control logic each comprising a respective status register configured to store status information, and wherein each of the sequencer and the control logic are configured to provide, to the status intermediary, respective status signals corresponding to the status information.

4. The apparatus of claim 1, wherein the controller is coupled to sensing circuitry of an array of memory cells, the controller being configured to control the sensing circuitry to perform memory operations and compute operations.

5. The apparatus of claim 4, wherein the sensing circuitry of the array of memory cells comprises sense amplifiers and corresponding compute components on a per column basis.

6. The apparatus of claim 1, wherein the status information comprises N bits that is a positive integer greater than one, and wherein:
the status information in the time-division multiplexed form is provided to the status arbiter over fewer than N data paths.

7. An apparatus, comprising:
a status arbiter; and
a controller comprising a status register and a status intermediary configured to:
provide, to the status arbiter, a status signal indicating that the status register of the controller contains status information, requested by the status intermediary, comprising N bits of status information, wherein N is a positive integer greater than one;
in response to receiving a status grant signal from the status arbiter, provide, to the status arbiter, the status information that are time-division multiplexed at the status intermediary over fewer than N data paths.

8. The apparatus of claim 7, wherein the status arbiter is configured to continuously monitor the status signal provided from the status intermediary.

9. The apparatus of claim 7, wherein the status arbiter is configured to send, via an inband data bus, the status information to a host.

10. The apparatus of claim 7, wherein the status arbiter is configured to send the status information to a host via an out-of-band bus.

11. The apparatus of claim 7, wherein the status intermediary is configured to reset the status register when the status intermediary receives the status information from the status register.

12. The apparatus of claim 7, wherein the controller is configured to control sensing circuitry to perform memory operations and compute operations.

13. A system, comprising:
a controller comprising
a status intermediary; and
a status register; and
a status aggregator configured to provide, in response to receipt of a status signal from the status register, a status grant signal to the status intermediary, wherein the status signal indicates that the status register coupled to the status intermediary contains N bits, wherein N is a positive integer greater than one;
wherein the status intermediary is configured to, in response to receipt of the status grant signal from the status aggregator:
time-division multiplex the status information requested from the status register; and
provide, to the status aggregator, the status information in a time-division multiplexed form over fewer than N data paths.

14. The system of claim 13, wherein the status aggregator is configured to encode the status information received from the status intermediary using an 8b/10b encoding.

15. The system of claim 14, wherein the status aggregator comprises a data serializer, and wherein the encoded status information are provided to the data serializer in parallel.

16. The system of claim 13, wherein the status aggregator is configured to serialize the status information received from the status intermediary.

17. The system of claim 13, wherein:
the status register is one of a plurality of status registers configured to store N bits of status information; and
the status intermediary is configured to selectively couple, via a wired OR configuration, one of a plurality first N-bit data paths associated with the plurality of respective status registers to a second N-bit data path to the status aggregator.

18. The system of claim 13, wherein the status aggregator is configured to send, via a data bus, the status information to a host.

19. The system of claim 13, wherein the status aggregator is free of a first-in-first-out (FIFO) register.

20. The system of claim 13, wherein the status aggregator includes a state machine.

* * * * *